United States Patent [19]

Ohta

[11] Patent Number: 4,771,193
[45] Date of Patent: Sep. 13, 1988

[54] SYNCHRONIZING CIRCUIT

[75] Inventor: Genichiro Ohta, Ebina, Japan

[73] Assignee: Matsushita Electric Industrial Co., Ltd., Osaka, Japan

[21] Appl. No.: 945,642

[22] Filed: Dec. 23, 1986

[30] Foreign Application Priority Data

Dec. 27, 1985 [JP] Japan .................................. 60-296713
Dec. 27, 1985 [JP] Japan .................................. 60-296714

[51] Int. Cl.$^4$ ........................ H03K 4/10; H03K 4/86
[52] U.S. Cl. .................................. 307/518; 307/228; 307/265; 328/72; 328/109; 328/185
[58] Field of Search ................ 328/109, 185, 181, 72, 328/60; 307/228, 265, 518, 597, 351; 364/487

[56] References Cited

U.S. PATENT DOCUMENTS

| 3,571,755 | 3/1971 | Ejiri | 331/143 |
| 3,718,825 | 2/1973 | Matsuoka | 328/185 |
| 3,851,262 | 11/1974 | Hohmann | 328/185 |
| 4,647,862 | 3/1987 | Blair | 328/109 |

Primary Examiner—Stanley D. Miller
Assistant Examiner—Richard Roseen
Attorney, Agent, or Firm—Stevens, Davis, Miller & Mosher

[57] ABSTRACT

A synchronizing circuit for an oscilloscope or the like, in which in the case where a sync input signal contains composite periods like a PCM signal or video signal, it is identified to generate a sync pulse. The change-over operation of variable time-constant range of the sync identification circuit is electronically automated to meet a wide range or period. Also, automatic sweep time change-over becomes possible by interlocking the sweep circuit time-constant switch to the output data.

14 Claims, 4 Drawing Sheets

SYNCHRONIZING CIRCUIT

BACKGROUND OF THE INVENTION

The present invention relates to a synchronizing circuit for a waveform observing apparatus such as an oscilloscope.

In conventional oscilloscopes, an observed signal is applied to a sync circuit for comparison with a triggering voltage level, and triggering pulses are generated at a timing when the observed signal exceeds the triggering voltage level thereby to display the desired still waveform of the observed signal.

When this technique is applied to digital signals or other complicated signals such as video signals it has become impossible to distinguish the periodic characteristics of the observed signal, so that it is difficult to obtain a desired observation as a result of a superposed display of waveforms with the same triggering voltage level but different periods one on another.

One of the conventional ways to obviate this inconvenience is to provide a band-pass filter which operates as a periodic signal extractor for a commercial video signal. However, use of such an extractor is troublesome and is not applicable for observation of other types of signals.

SUMMARY OF THE INVENTION

In order to obviate the above-mentioned problems, the present invention has the object of providing a sync circuit for signals such as time-sharing signals having a respective periodic non-signal (space) portion in their every predetermined period, the circuit operating such a non-signal interval as a kind of partial pulse and detecting it to grasp the periodic characteristic of the respective signal by taking advantage of the fact that such a partial pulse width is longest.

According to the present invention with the aforementioned configuration, wide and various ranges of periods are identified by discriminating a comparative length of such a period thereby to stabilize the desired sync operation.

DESCRIPTION OF THE PREFERRED EMBODIMENTS

Figure 1:
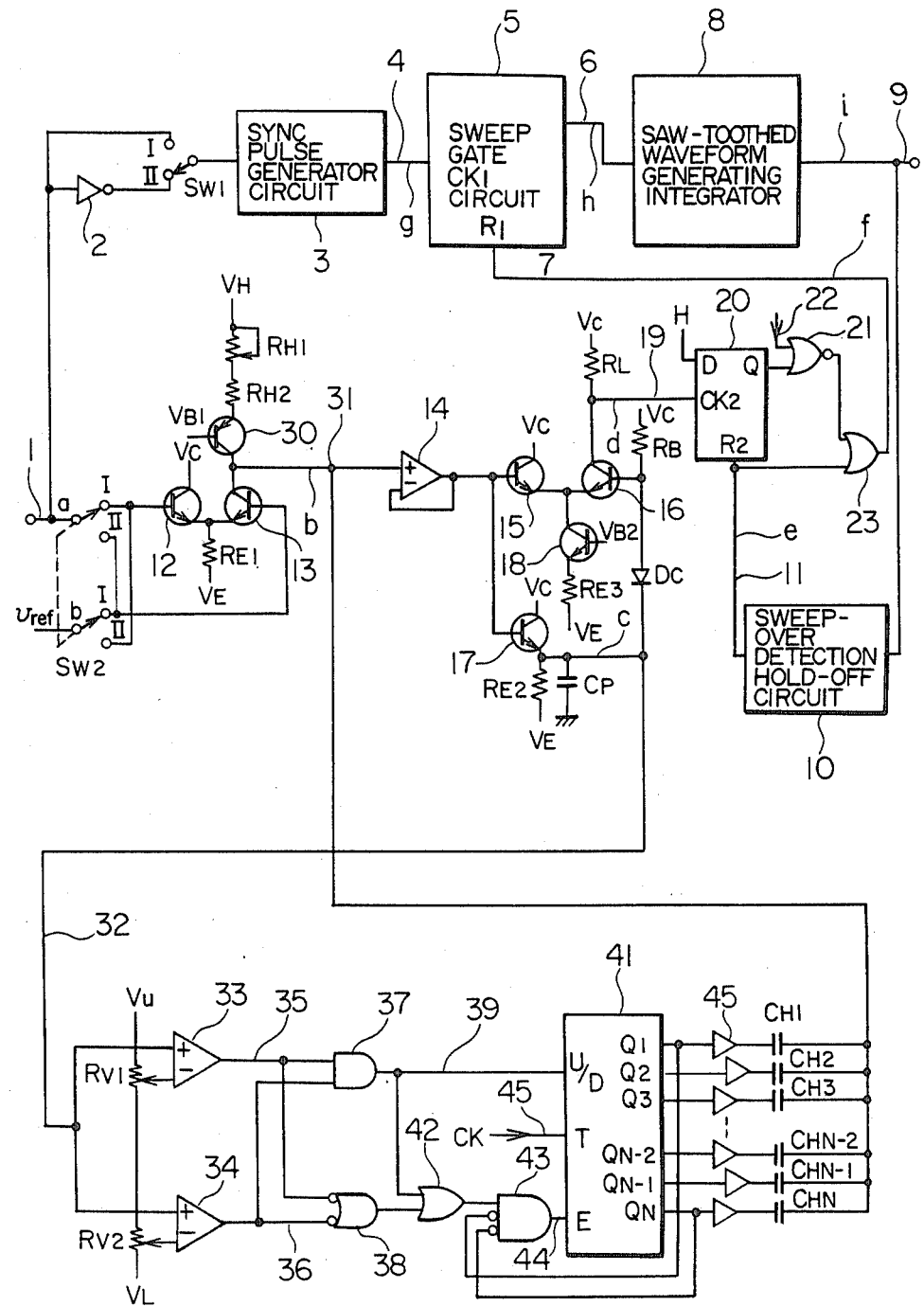
FIG. 1 is a diagram showing a sync circuit according to an embodiment of the present invention.

A circuit of a sync circuit according to the present invention is shown in FIG. 1. In FIG. 1, an observed signal or a sync signal is applied to a sync circuit input path 1, which signal is connected to a sync signal polarity switch $SW_1$ together with an inverted output of a polarity-inverting amplifier 2 to which the sync signal is applied.

The output selected at $SW_1$ is applied to a sync pulse generator circuit 3 and formed into a sync pulse output 4 thereby to drive a sweep gate circuit 5 including a bistable circuit. The output 6 of the sweep gate circuit 5 controls the integrating operation of a sawtooth wave generating integrator 8 thereby to produce a sawtooth wave output signal 9. The output signal 9 is applied to a sweep-end detection and hold-off circuit 10, and a hold-off signal 11 is generated to suspend the restart of sweep during the hold-off period from a sweep-end time thereby to control a reset input R of the sweep gate circuit 5.

On the other hand, the input 1 is applied to a period detection and polarity switch $SW_2$ together with a reference voltage $V_{ref}$, and each selected output is applied as an input to a differential amplifier including a pair of transistors 12 and 13 making up a period detection integrator circuit gate. The collector of the transistor 13 of the differential amplifier is connected to a power supply through resistors $R_{H1}$ and $R_{H2}$ for adjusting the integration current on the one hand and to the earth through a plurality of integration capacitors $C_{Hi}$ (i=1, 2, 3, ... N−2, N−1, N) on the other hand. The terminal voltage of these integration capacitor $C_{Hi}$ is detected through a buffer amplifier 14 and applied to one of the inputs of the differential amplifier including the transistors 15 and 16, while at the same time being connected to the input of the emitter-follower 17. The output of the emitter-follower 17 is connected to a peak voltage-holding capacitor $C_P$ and further to the input section of the other transistor 16 of the differential amplifier through an offset voltage-compensating diode Dc. The collector output 19 of this transistor is supplied as a clock input for a flip-flop circuit 20 with the output 11 of the sweep-end detection and hold-off circuit 10 as a reset signal. The Q output of the flip-flop circuit is applied to gate circuits 21 and 23 whereby the Q output and the above-mentioned hold-off signal 11 are electronically selected by a control signal 22 for enabling or disabling the hold-off function thereby to control the reset input $R_1$ of the sweep gate circuit 5.

The terminal voltage 32 of the capacitor $C_P$ is connected to the input terminals of the comparators 33 and 34. The reference signal $V_1$ for the comparator 33 is obtained from the variable resistor $R_{V1}$, and the reference signal $V_2$ for the comparator 34 from the variable resistor $R_{V2}$. The variable resistors $R_{V1}$ and $R_{V2}$ are connected with each other at a respective fixed terminal, the respective other terminal being connected to voltage sources $V_u$ and $V_L$ respectively. The outputs 35 and 36 of the comparators 33 and 34 are applied to inputs of gate circuits 37 and 38. The output 39 of the gate circuit 37 is connected to the up-down control input terminal u/D of an up-down counter 41 on the one hand and to the input of a gate circuit 42 together with the output of the gate circuit 38 on the other hand. The up-down counter 41 is connected with a clock signal CK at the clock input terminal T to give a count result at selected one of the count outputs $Q_1$, $Q_2$, $Q_3$, ..., $Q_{N-1}$, $Q_{N-1}$, $Q_N$. Also, the counter 41 has an enable signal input terminal E and obtains an enable signal from the output 44 of the gate circuit 43 to which the outputs $Q_1$ and $Q_N$ of the counter 41 and the output of the gate circuit 42 are applied.

The outputs $Q_1$, $Q_2$, $Q_3$, ..., $Q_{N-2}$, $Q_{N-1}$, $Q_N$ of the up-down counter 41 are connected to the other terminal of the capacitors $C_{H1}$, $C_{H2}$, $C_{H3}$, ..., $C_{HN-2}'$ $C_{HN-1}$, $C_{HN}$ through a respective buffer gate 45 with an open-collector output respectively.

In FIG. 1, the circuit connection made up of 1, 2, $SW_1$, 3, 4, 5, 8, 10, 11 and 7 in that order obviously constitutes a typical sync sweep circuit used in an ordinary oscilloscope. Detailed explanation of each part or a specific example thereof will be omitted.

Figure 2:
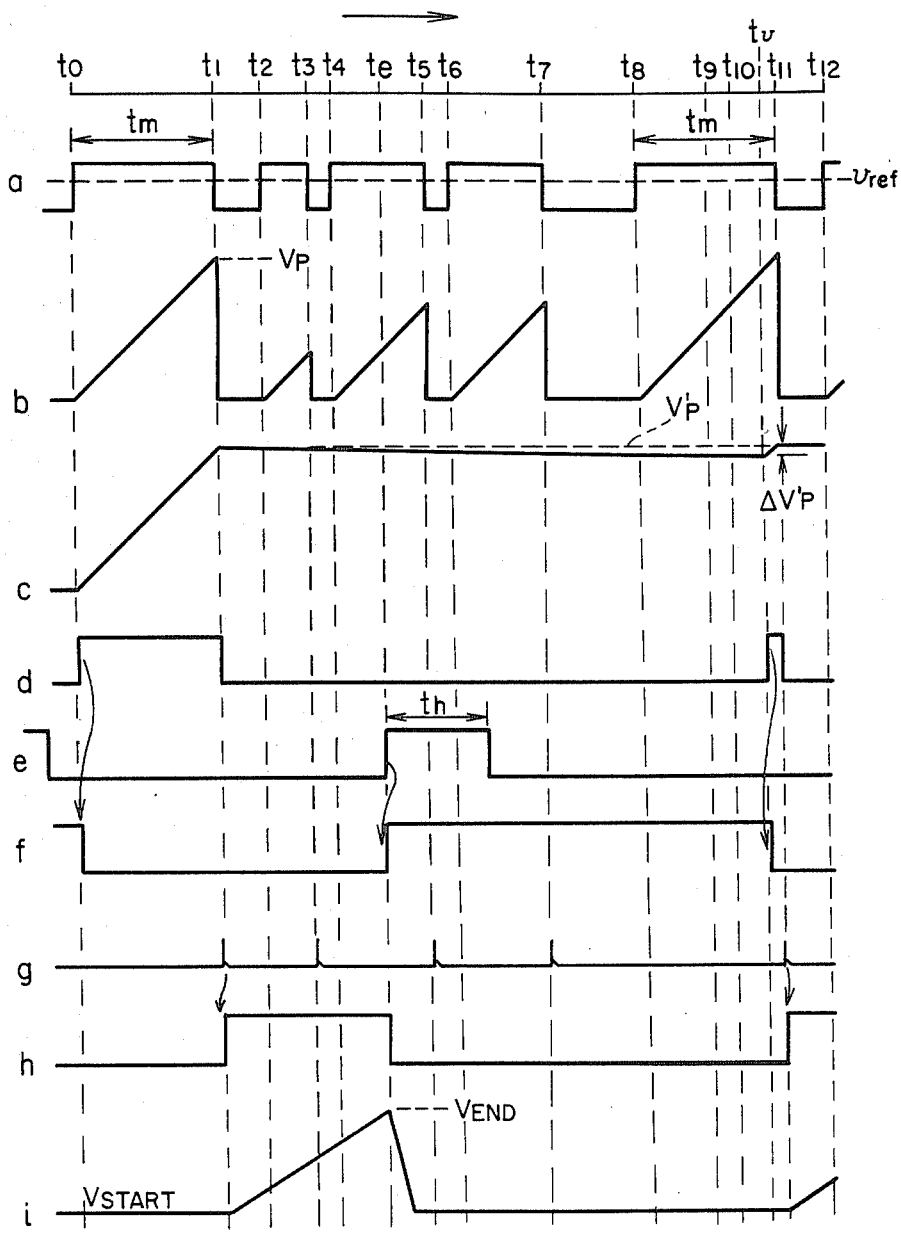
FIGS. 2 and 3 show signal waveforms according to the same embodiment.

The operation of the circuit shown in FIG. 1 will be explained with reference to an example of circuit waveforms shown in FIG. 2. In FIG. 2, reference character a designates an example of an observed signal or sync signal supplied to a signal input path, b a terminal voltage of the integration capacitor $C_H$, c the voltage applied to the base of the transistor 16, d the output voltage appearing at the collector of the transistor 16, e the output 11 of the hold-off circuit 10, f the Q output of the flip-flop 20 passed through the gate circuits 21 and 23, h the output 6 of the sweep gate circuit 5, and i the output 9 of the saw-tooth wave generating integrator 8.

Assume that the sweep gate circuit 5 completes the hold-off period before time $t_0$ and becomes ready for sweep start or ready to wait for generation of the sync pulse g. Also assume that the switches $SW_1$ and $SW_2$ are set in the state shown in FIG. 1.

Suppose that during the period from time $t_0$ to time $t_{11}$, the signal a of the input path 1 undergoes a change as shown in FIG. 2, and during the same period, the longest pulse duration $t_m$ of high level occurs between time $t_0$ and $t_1$ and between time $t_8$ and $t_{11}$. The signal a of the input path 1 is applied from the terminal a of the switch $SW_2$ to the base of the transistor 12. Since the transistors 12 and 13 make up an emitter-coupled differential amplifier, the transistor 12 conducts and the transistor 13 is cut off if the signal a is higher in potential than the reference voltage Vref supplied through the terminal b of the switch $SW_2$ applied to the base of the transistor 13. As a result, in the case where the reference voltage Vref is at a level shown by the dashed line in FIG. 2a, therefore, the transistor 13 is cut off during the periods from $t_0$ to $t_1$, from $t_2$ to $t_3$, from $t_4$ to $t_5$, from $t_6$ to $t_7$ and from $t_8$ to $t_{11}$, while it conducts during the other periods.

The collector of the transistor 13 is connected to a terminal of the capacitor $C_{Hi}$ (i: 1, 2, 3, ..., N−1, N−2, N) and a terminal of the resistor $R_{H2}$, so that the current flowing through the resistors $R_{H1}$ and $R_{H2}$ from the power supply $V_H$ and the charges stored in the capacitor $C_{Hi}$ (i: 1, 2, 3, ..., N−2, N−1, N) are all sinked and discharged by the transistor 13 during the conduction of the transistor 13. While the transistor 13 is off, on the other hand, the current flowing from the power supply $V_H$ through the resistors $R_{H1}$ and emitter-follower with the capacitor $C_P$ inserted between the emitter thereof and the earth. In the case where the transistor 17 is made up of an NPN transistor as shown in FIG. 1, the emitter potential is followed in polarity fashion against the increase in base input, and therefore the terminal voltage of the capacitor $C_P$ takes a waveform C of FIG. 2. Thus, the maximum voltage $V'_P$ is substantially maintained if the small discharge $\Delta V'_P$ due to the leak current of capacitor $C_P$ and the resistor $R_{E2}$ during the period before the increase to the potential $V'_P$ corresponding to $V_P$ of the waveform b at time point $t_1$ and the increase again to $V'_p$ at time point $t_{11}$ is ignored.

The output of the buffer amplifier 14, on the other hand, is supplied also to the base of the transistor 15. The transistor 15, together with the transistor 16, makes up a differential amplifier with the constant current from the transistor 18 as an emitter current. The base of the transistor 16 is connected to the terminal voltage of the capacitor $C_P$ via the offset diode Dc, and therefore, the transistor 16 turns off during the period when the base voltage thereof becomes lower than the base voltage of the transistor 15 equal to the waveform b of FIG. 2, that is, during the period, in the example of FIG. 2, from time point $t_0$ to $t_1$ and from just before $t_{11}$ to the time point $t_{11}$. As a result, a high potential is achieved during the period from $t_0$ to $t_1$ and from just before time point $t_{11}$ to time point $t_{11}$ as shown by the waveform d of FIG. 2. The collector output voltage 19 is applied to the clock input CK of the flip-flop 20. Assuming that the hold-off state is complete by the sweep operation before time $t_0$ as described above, the hold-off signal 11 applied to the reset terminal $R_1$ of the sweep gate circuit 5 is at low potential as shown by the waveform e in FIG. 2, that is, to terminate the reset operation. The hold-off signal 11 is connected to the reset terminal $R_2$ of the flip-flop 20 at the same time, and therefore the flip-flop 20 is at least ready for clock input in FIG. 1. When the control input 22 of the gate 21 is at low potential, in contrast, the output 7 of the gate circuit 23 remains high with the hold-off signal 11 alone at low potential.

The operation of this part will be explained from time $t_0$. Assume that the capacitor $C_P$ is not charged to high potential before time point $t_0$. The collector output of the transistor 16 becomes high for the first time with the arrival of a signal at time point $t_0$, and at the same time, the Q output of the flip-flop 20 becomes high. As a consequence, the output of the gate circuit 21 becomes low in potential at time $t_0$, with the result that the signal 7 to the reset $R_1$ of the sweep gate circuit 5 becomes low immediately after time point $t_0$. In this way, the sweep gate circuit 5 is capable of placing the clock $CK_1$ input in ready state from immediately after time point $t_0$. Assume that the sync signal polarity switch $SW_1$ selects a polarity inverted output as shown in FIG. 1 and that a sync pulse output 4 is produced from the sync pulse generator circuit 3 at the rising slope portion of the input signal from the switch $SW_1$. The sync pulse output 4 takes a waveform g shown in FIG. 2 in comparison with the signal of waveform a in FIG. 2.

The sweep gate circuit 5 which holds the clock input ready state from immediately after time point $t_0$, therefore, inverts the output 6 in the manner shown by waveform h of FIG. 2 by the sync pulse output 4 (FIG. 2g) generated at the time of fall of the input signal of FIG. 2a at time point $t_1$, thus starting the saw-tooth waveform generating integrator 8 to perform the integrating operation in the manner shown by the waveform i. When the integration output 9 reaches the sweep end voltage shown by $V_{END}$ at time point $t_e$ as shown by the waveform i of FIG. 2, the output 11 of the sweep-end detection and hold-off circuit 10 changes to a high potential to end the sweep in the manner shown in FIG. 2e. Thus the sweep gate circuit 5 that receives the output 11 through the gate circuit 23 and the flip-flop 20 resets again, so that the output 6 thereof causes the output 9 of the saw-tooth wave generating integrator 8 to restore to the sweep start voltage $V_{START}$ designated in FIG. 2i. Since the reset operation of the flip-flop 20 inverts the output Q to high potential, on the other hand, the output 7 of the gate circuit 23 to the reset terminal $R_1$ of the sweep gate circuit 5 continues to hold the high potential in the manner shown by waveform f of FIG. 2 even if the hold-off signal 11 that has passed through the gate circuit 23 is inverted to low level after the lapse of hold-off time $t_h$. As a result, the restart of sweeping operation of the sweep gate circuit 5 is prevented.

The flip-flop 20 that has thus far prevented the restart of sweep operation inverts the output Q to high potential by the clock input 19 (waveform d of FIG. 2) from the transistor 16 generated when the next maximum pulse duration signal approaches the maximum pulse duration tm at time point tv. Therefore, the output 7 of the gate circuit 23 finally inverts to low potential allowing the sweep gate circuit 5 to receive the sync pulse output 4. As a result, the next sweep is started with the sync pulse output at time point $t_{11}$ of FIG. 2g which is generated immediately thereafter.

Specifically, in FIG. 1, the sweep operation is accurately started at the falling slope portion where the longest pulse duration tm of the signal of FIG. 2a is completed. It is thus possible to observe a stable still waveform on the oscilloscope which starts the falling slope portion of the pulse duration tm by the sweep signal thus obtained.

It is clear that this operation is repeated accurately as long as the maximum pulse duration period continues to exist as a periodic signal with the cycle from time $t_0$ to time $t_8$.

The waveform a of FIG. 2 indicates the case in which the longest pulse duration period is at higher potential than the reference voltage Vref. In the case where a signal containing the longest pulse duration period at the low-potential portions thereof, in contrast, quite the same operation is realized after the collector of the transistor 13 by selecting the position 11 of the period detecting polarity switch SW$_2$ which is opposite to that in FIG. 1, thus making it possible to grasp the periodic characteristics.

It is also possible to obtain the sweep start at the rising slope of the signal by selecting the position I of the sync signal polarity switch SW$_1$ opposite to that in FIG. 1, so that the sweep operation is started at time point $t_2$ or $t_{12}$ for the waveform shown in FIG. 2a.

In the case where the control input 22 of the gate circuit 21 is rendered high in potential, on the other hand, the Q output of the flip-flop 20 is prevented be transmitted to the gate circuit 23 and the signal from the gate circuit 21 to the gate circuit 23 remains at low potential. Thus, the reset input R$_1$ of the sweep gate circuit 5 is always controlled by the hold-off signal 11.

Specifically, the control operation of the sweep gate circuit 5 is effected in its entirety by the hold-off signal 11 and the sync pulse 4 only, and therefore the gate circuit 5 may function as an ordinary sync sweep circuit.

Now, the operation of the capacitors $C_{H1}$, $C_{H2}$, $C_{H3}$, ..., $C_{HN-2}$, $C_{HN-1}$, $C_{HN}$ will be explained with reference to the example shown in FIG. 3.

Figure 3:
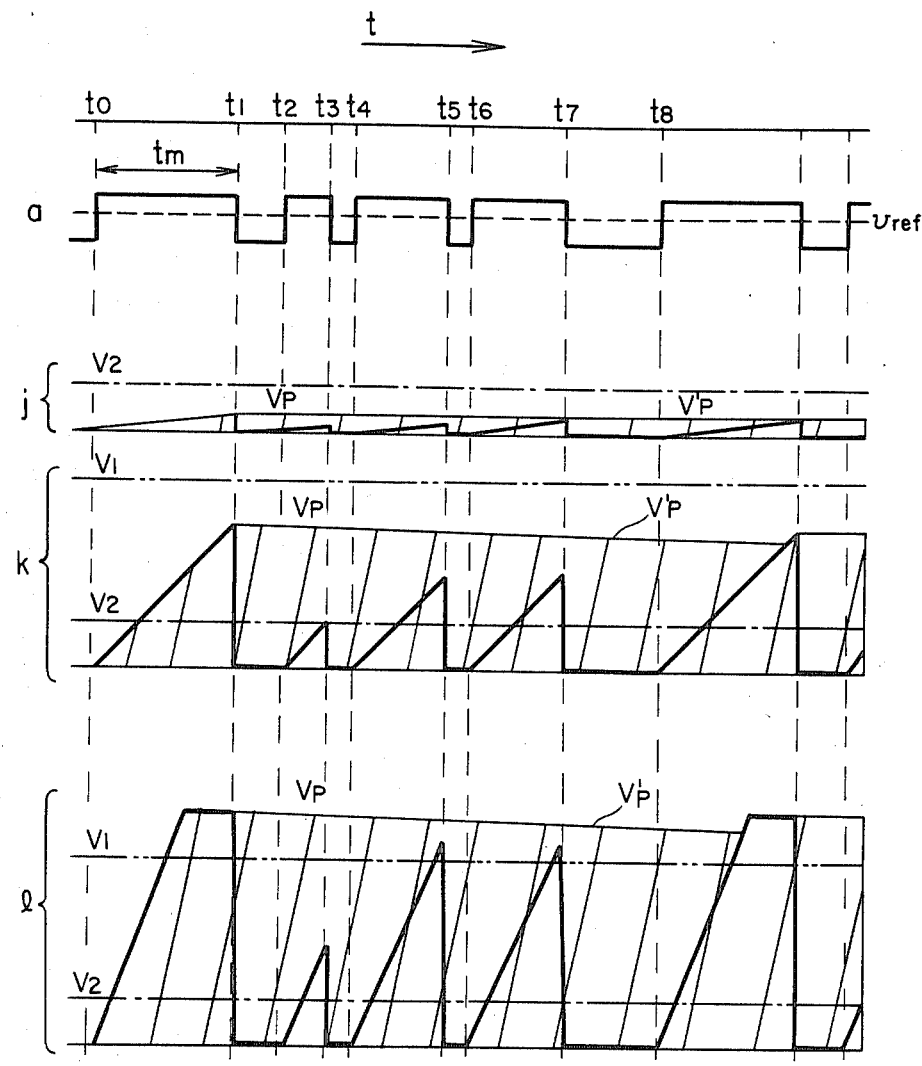

The waveform a in FIG. 3 corresponds to the waveform a in FIG. 2 and is an example to be applied to the sync circuit input path 1 in FIG. 1. The waveforms j, k and l in FIG. 3 show different responses to the waveform a of the voltage at a common terminal of the integration capacitors $C_{H1}$, $C_{H2}$, $C_{H3}$, ..., $C_{HN-2}$, $C_{HN-1}$, $C_{HN}$, which will be explained below.

The amount of current $I_H$ flowing into the integration capacitors through the collector of the transistor 30 is determined by the equation below.

$$I_H = \frac{V_H - V_{BI} - V_{BE}}{R_{H1} + R_{H2}} - I_B \quad (1)$$

where $V_{BE}$ is the base-emitter voltage of the transistor 30, and $I_B$ the base current thereof. When $V_{BE}$ and $I_B$ are sufficiently large, they can both be ignored, and therefore $$I_H \simeq \frac{V_H - V_{BE}}{R_{H1} + R_{H2}} \quad (2)$$

which represents a DC current.

Only one of the integration capacitors $C_{H1}$, $C_{H2}$, $C_{H3}$, ..., $C_{HN-1}$, $C_{HN}$ is equivalently grounded by the control of the outputs $Q_1$, $Q_2$, $Q_3$, ..., $Q_{N-2}$, $Q_{N-1}$, $Q_N$ of the up-down counter 41 connected through an open-collector buffer gate 45 thereto.

Assume that only one of the outputs $Q_1$, $Q_2$, $Q_3$, ..., $Q_{N-2}$, $Q_{N-1}$, $Q_N$ of the up-down counter 41 produces an output $Q_i$ (i: 1, 2, 3, ..., N−2, N−1, or N) indicating a high-potential output. Also assume that when the up-down control signal 39 is at high potential, the up-down counter 41 increments or counts up the output position $Q_i$ once by means of each input of the clock signal CK, proceeding to $Q_{i+1}$, $Q_{i+2}$, ..., $Q_N$ sequentially. In similar fashion, it is assumed that when the up-down control signal 39 is at low level, the output position is decremented or counted down once by means of each clock signal CK, thus sequentially proceeding to $Q_{i-1}$, $Q_{i-2}$, ..., $Q_1$.

If the integration capacitor controlled by the output $Q_i$ is designated by $C_{Hi}$, the voltage $V_P$ appearing across the terminals of the integration capacitor $C_{Hi}$ at the time point $t_1$ in FIG. 3 is given as $$V_P = \frac{1}{C_{Hi}} \int_{t_0}^{t_1} I_H dt \quad (3)$$

Developing equation (3) and substituting $t_1 - t_0 = t_m$, $$V_P = \frac{1}{C_{Hi}} \cdot (t_1 - t_0) \cdot I_H \quad (4)$$
$$= \frac{I_H \cdot t_m}{C_{Hi}}$$

As seen from equation (4), in the case where the circuit constants are fixed, that is, when the integration charge current $I_H$ and the capacitance of the integration capacitor $C_{Hi}$ is kept constant, it is necessary to secure the integration peak voltage $V_P$ wide in range proportional to $t_m$ which is capable of corresponding to all pulse durations $t_m$ in the range covered by observation of unspecified signals on an instrument, as well as the operation of subsequent circuits. This, however, is impossible to achieve practically.

This fact will be explained with reference to FIG. 3. Assume that the integration circuit of the transistor 13, a subsequent buffer amplifier 14, the transistor 17 for peak detection and the transistor 15 for differential amplification are able to operate stably within a signal voltage range with upper limit $V_1$ and lower limit $V_2$. Assume also that the integration current $I_H$ is set to 1 mA and the integration capacitor $C_{Hi}$ to 1 μF, and the upper limit voltage $V_1$ is 5 V and the lower limit voltage 0.5 V. As shown in FIG. 3k, the pulse duration which causes the peak voltage $V_P$ of the integration output to exist between $V_1$ and $V_2$ is required to be from 5 ms to 0.5 ms, indicating that the signal to be observed is quite limited.

According to the present invention, in order to solve this problem, the peak detection voltage 32 is applied to both comparators 33 and 34, and the upper limit voltage $V_1$ and the lower limit voltage $V_2$ are produced from a voltage setting circuit including voltage sources $V_u$, $V_L$ and resistors $R_{V1}$, $R_{V2}$ respectively, which are applied to the reference signal input (−) of the comparators 33 and 34 respectively. In the case where the longest pulse duration $t_m$ is smaller than the integration capacitor $C_{Hi}$ and the integration output $V_P$ fails to reach the lower limit voltage as shown in FIG. 3j, the outputs 35 and 36 of the comparators 33 and 34 are reduced in potential, so that the low-voltage output due to the "and" logic operation of the gate circuit 37 causes up-down counter 41 to decrement. As a result, the grounded integration capacitor is set to $C_{i-1}$ by the output $Q_{i-1}$. If the integration capacitor $C_{i-1}$ is set to static capacitance one tenth of the integration capacitor $C_{Hi}$, a single decrement increases the integration peak voltage $V_P$ to a wave height ten times higher. By repeating the decrement operations, therefore, it is always possible to increase the integration peak voltage $V_P$ beyond the lower limit voltage $V_2$ as shown in FIG. 3k.

In the case where the longest pulse duration $t_m$ is so long as compared with the integration capacitor $C_{Hi}$ that the integration output $V_P$ exceeds the upper limit voltage as shown in FIG. 3, on the other hand, the comparator outputs 35 and 36 increase to a high voltage, and the gate circuit 37 causes the increment operation of the up-down counter 41 at an output in high potential. As a result, with the increased capacity of the integration capacitor $C_{i+1}$ grounded by the output $Q_{j+1}$, the integration peak voltage $V_P$ is reduced. By repeating the increment operations, it is always possible that the integration peak voltage $V_P$ is exceeded by the upper limit voltage $V_1$ in the manner shown in FIG. 3k.

If the ratio between upper limit voltage $V_1$ and lower limit voltage $V_2$ is 10 or more to 1, the integration capacitors $C_{H1}$, $C_{H2}$, $C_{H3}$, $C_{H4}$, ..., $C_{HN-2}$, $C_{HN-1}$, $C_{HN}$ may be set to a capacitance ten times higher respectively. If the pulse duration involved is 1 second to 1 microsecond, for instance, six types of capacitors are used.

The gate circuit 43 is for controlling the enable control terminal E of the up-down counter 41. The proper state of the integration peak voltage $V_P$ is detected from the low-potential output of the gate circuits 37 and 38 through the gate circuit 42 as shown in FIG. 3k. Also, the state of the output of the up-down counter 41 at lower limit $Q_1$ or upper limit $Q_N$, that is, the state thereof within the signal range involved, is detected by a signal obtained from the outputs $Q_1$ and $Q_N$ respectively, in which case the output 44 is reduced to a low potential, thereby suspending the increment or decrement operation of the up-down counter 41.

Figure 4:
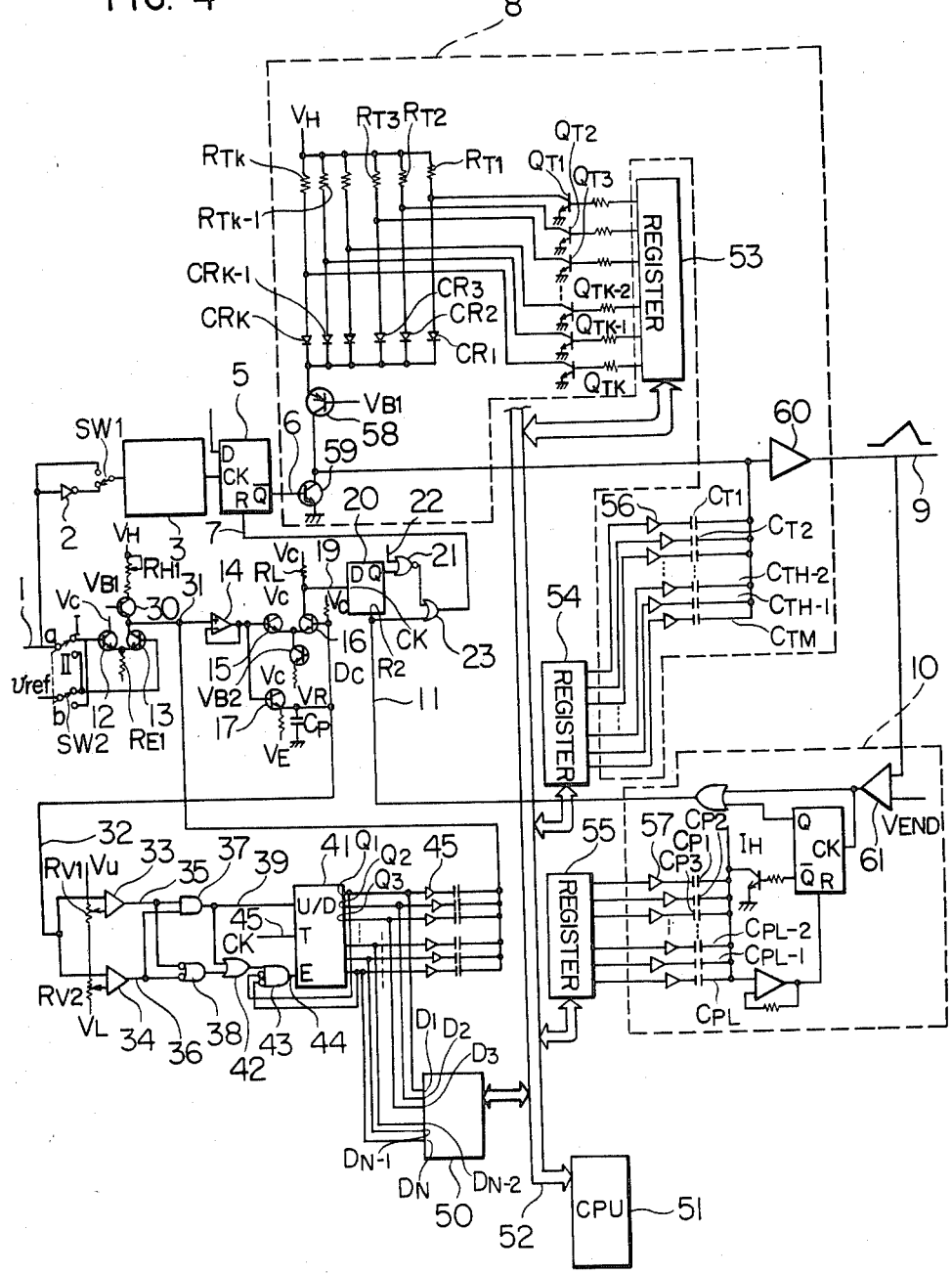
FIG. 4 is a circuit diagram of a second embodiment of the present invention.

As second embodiment of the present invention is shown in FIG. 4. In this specific example, a control function with CPU is added to the first embodiment shown in FIG. 1 to provide automatic control of the whole sync sweep circuit.

Numerals 5, 6, 8 and 10 in FIG. 4 denote exactly the same functions as those with similar designations in FIG. 1, and the explanation with reference to FIG. 1 should be referred to for the operation of the whole circuit.

Assume that selection of an integration capacitor $C_H$ corresponding to a sync signal is executed by the up-down counter 41. Under this condition, the shift register 50 transmits the output data $Q_1$ to $Q_N$ of the up-down counter 41 to CPU 51 through the bus 52. In order to determine the desired sweep speed on the basis of these data, CPU 51 applies the setting data to the register 53 whereby one of the integration current-setting resistors $R_{T1}$ to $R_{TK}$ of the saw-tooth wave-generating integrator 8 to be connected through diodes $CR_1$ to $CR_K$ to the constant current-generating transistor 58, while the setting data for determining one of the integration capacitors $C_{T1}$ to $C_{TN}$ for integration is sent to the register 54.

At the same time, in order to secure the hold-off time for full discharge at the time of sweep reset of the integration capacitors $C_{T1}$ to $C_{TM}$, CPU 51 applies to the register 55 data for determining one of the hold-off capacitors $C_{P1}$ to $C_{PL}$. Automatic setting of sweep speed is also possible by transmitting the up-down counter outputs $Q_1$ to $Q_N$ directly to change-over transistors $Q_{T1}$ to $Q_{TK}$, buffer 56 and buffer 57. In this case, the degree of freedom of the range of sweep speed to be set is low, although a simple configuration is possible without CPU, register, or bus. For sake of precaution it is noted that numeral 59 designates a transistor for a gate of the saw-tooth signal generator, 60 a buffer amplifier having a high input impedance, 61 a comparator to detect the excess of a saw-tooth signal to the voltage $V_{END}$, and $I_H$ a current source for the integrator of hold-off period generator.

It is well known that the CPU 51 is capable of being provided with a function to transmit data through a second bus to external units, and according to the present invention, this function is considered possible even though there is no explanation thereof included herein.

As obvious from the foregoing description of embodiments, according to the present invention, the no-signal section which is periodically formed in such a signal as a time-shared digital signal is handled as a partial pulse, and taking advantage of the fact that the pulse duration of such a section is longest, this pulse is detected, while at the same time grasping the periodic characteristics thereof. It is thus possible to stabilize the desired sync operation by identifying the width of the range of period involved from the length of the period.

Further, taking advantage of the fact that the output data of the up-down counter for which the periodic characteristics has been grasped indicates a relative period, the sweep speed as an oscilloscope can be set automatically, thereby releasing the operator of the operating troubles.

Another advantage of the present invention is that in the case where a sync input signal has composite periods like PCM signal or video signal, the sync signal is automatically extracted without troublesome operations of changing the central frequency of a band-pass filter circuit, thereby making it possible to make stable observations free of flickering on the display screen.

According to still another advantage of the present invention, means for comparing the voltages of an observed signal or a sync signal, and detecting the longest still section of a pulse train shaped. This configuration permits the period of many signals to be determined from the longest pulse duration thereof, thereby making it possible to observe stably a pulse train or a video signal which is apparently difficult to identify, without any flicker on the display screen.

A still further advantage of the present invention resides in the fact that output data of an up-down counter that has grasped the periodic characteristics is utilized as data indicating a relative period to determine the sweep speed as an oscilloscope automatically. It is thus possible to switch the sweep time automatically, thereby further improving the operability.

I claim:

1. A synchronizing circuit comprising:
   means for generating a trigger signal when an observed signal exceeds a trigger level;
   means responsive to the trigger signal for detecting a longest pulse duration of observed signals by integrating and holding pulse durations of observed signals, said detecting means resetting with a pulse duration of an observed signal which is no shorter than a pulse duration of preceding observed signals;
   means for enabling a sweep circuit during the longest detected pulse duration of observed signals detected by said detecting means; and
   means for ending a hold-off period of said sweep circuit at a trailing edge of a longest detected pulse duration.

2. A synchronizing circuit for an oscilloscope comprising a sync pulse generator circuit for detecting a selected one of the rise and fall of an observed signal and producing a sync pulse signal, a sweep gate circuit supplied with the sync pulse signal as a clock input and including a flip-flop circuit adapted to be reset by a reset signal, a saw-tooth wave generating integrator for integrating an output signal of the sweep gate circuit and generating a saw-tooth wave signal to be used as a horizontal sweep signal for said oscilloscope, a pulse duration detecting integrator for integrating the observed signal and providing an integrated output signal, a peak value holding circuit for holding a peak value of said integrated output signal, a differential amplifier for producing a differential voltage from said integrated output signal and an output signal of the peak value hold circuit as a reference voltage, a hold-off circuit for detecting an end of an output signal from the saw-tooth wave generating integrator and producing a hold-off signal, a longest duration detector circuit having a flip-flop circuit with a reset input supplied with the hold-off signal and a clock input supplied with an output signal of the differential amplifier as a clock signal and providing a control signal for said sweep gate circuit, and means for using a selected one of the control signal of the longest duration detector circuit and the hold-off signal as a reset signal for the sweep gate circuit.

3. A synchronizing circuit for an oscilloscope comprising a sync pulse generator circuit for detecting a selected one of the rise and fall of an observed signal and producing a sync pulse signal, a sweep gate circuit supplied with the sync pulse signal as a clock input and including a flip-flop circuit adapted to be reset by a reset signal, a saw-tooth wave generating integrator for integrating an output signal of the sweep gate circuit and generating a saw-tooth wave signal to be used as a horizontal sweep signal for the oscilloscope, a pulse duration detecting integrator for integrating the observed signal and providing an integrated output signal, a peak value holding circuit for holding a peak value of said integrated output signal, a differential amplifier for producing a differential voltage from said integrated output signal and an output signal of the peak value hold circuit as a reference voltage, a hold-off circuit for detecting an end of an output signal from the saw-tooth wave generating integrator and producing a hold-off signal, a longest duration detector circuit having a flip-flop circuit with a reset input supplied with the hold-off signal and providing a control signal for said sweep gate circuit, means for using a selected one of the control signal of the longest duration detection circuit and the hold-off signal as a reset signal for the sweep gate circuit, and correction means supplied with the reference voltage from the differential amplifier and comprising means for establishing a predetermined ratio between the upper and lower limits of the reference voltage, and an enable up-down counter is incremented or decremented by applied clock signal under control of said establishing means said up-down counter selecting an integration capacitor for said pulse duration detecting integrator to control the level of said peak value of said integrated output signal.

4. A synchronizing circuit according to claim 2, wherein said sync pulse generator circuit is supplied with an observed signal through a sync signal polarity switch.

5. A synchronizing circuit according to claim 3, wherein said sync pulse generator circuit is supplied with an observed signal through a sync signal polarity switch.

6. A synchronizing circuit according to claim 2, wherein the pulse duration detecting integrator is supplied with the observed signal through a period detection polarity switch.

7. A synchronizing circuit according to claim 3, wherein the pulse duration detecting integrator is supplied with the observed signal through a period detection polarity switch.

8. A synchronizing circuit according to claim 2, wherein a time constant of the pulse duration detecting integrator is variable.

9. A synchronizing circuit according to claim 3, wherein a time constant of the pulse duration detecting integrator is variable and is determined by said selected integration capacitor.

10. A synchronizing circuit according to claim 2, further comprising means responsive to a control signal for controlling the use of said control signal of said longest duration detection circuit as a reset signal for said sweep gate circuit.

11. A synchronizing circuit according to claim 3, further comprising means responsive to a control signal for controlling the use of said control signal of said longest duration detection circuit as a reset signal for said sweep gate circuit.

12. A synchronizing circuit according to claim 1, wherein a microcomputer is used for control.

13. A synchronizing circuit according to claim 2, wherein a microcomputer is used for control.

14. A synchronizing circuit according to claim 3, wherein a microcomputer is used for control.

* * * * *